United States Patent
Nakata et al.

[11] Patent Number: 5,952,898
[45] Date of Patent: Sep. 14, 1999

[54] SURFACE MOUNTING PIEZOELECTRIC FILTER WITH A SHIELD ELECTRODE ON A PACKAGE PARTITION WALL

[75] Inventors: Hozumi Nakata; Hiroyuki Arimura, both of Hyogo, Japan

[73] Assignee: Daishinku Corporation, Kakogawa, Japan

[21] Appl. No.: 09/043,925

[22] PCT Filed: Aug. 25, 1997

[86] PCT No.: PCT/JP97/02977

§ 371 Date: Apr. 9, 1998

§ 102(e) Date: Apr. 9, 1998

[87] PCT Pub. No.: WO98/09377

PCT Pub. Date: Mar. 5, 1998

[30] Foreign Application Priority Data

Aug. 30, 1996 [JP] Japan .................................... 8-230581

[51] Int. Cl.⁶ .............................. H03H 9/56; H03H 9/10; H03H 9/17

[52] U.S. Cl. .......................... 333/187; 310/326; 310/348; 310/353

[58] Field of Search ..................... 333/187–192; 310/340, 345, 348, 351–353, 321, 326, 365–368

[56] References Cited

U.S. PATENT DOCUMENTS 5,382,929  1/1995  Inao et al. ................................ 333/187

FOREIGN PATENT DOCUMENTS

| | | |
|---|---|---|
| 59-023910 | 2/1984 | Japan ..................................... 333/191 |
| 63-065707 | 3/1988 | Japan . |
| 2-056361 | 4/1990 | Japan . |
| 2-098207 | 4/1990 | Japan ..................................... 333/189 |
| 2-119406 | 5/1990 | Japan ..................................... 333/187 |
| 2-079574 | 6/1990 | Japan . |
| 2-261211 | 10/1990 | Japan . |
| 3-086623 | 9/1991 | Japan . |
| 6-006164 | 1/1994 | Japan ..................................... 333/187 |
| 6-085599 | 3/1994 | Japan . |
| 7-079127 | 3/1995 | Japan . |
| 8-097668 | 4/1996 | Japan . |

*Primary Examiner*—Robert Pascal
*Assistant Examiner*—Barbara Summons
*Attorney, Agent, or Firm*—Nikaido Marmelstein Murray & Oram LLP

[57] ABSTRACT

A piezoelectric filter element 1 is supported by the periphery of a package body 21 of the surface mounting type such that a pair of input/output oscillating electrodes 11, 12 of the piezoelectric filter element 1 face the package body 21. The package body 21 has a shield electrode 30 which extends along a gap G between the pair of input/output oscillating electrodes 11, 12, which presents a grounding potential, and which is apart away by a predetermined distance from a piezoelectric substrate 10. The shield electrode 30 is formed as extending along the gap G and does not face, in a broad area, the pair of input/output oscillating electrodes 11, 12. This prevents floating capacitance from being generated between the shield electrode 30 and the pair of input/output oscillating electrodes 11, 12. Accordingly, even though the shield electrode 30 is brought to very close to the piezoelectric substrate 10, the shield electrode 30 prevents the pair of input/output oscillating electrodes 11, 12 from being electromagnetically coupled with each other.

10 Claims, 4 Drawing Sheets

SURFACE MOUNTING PIEZOELECTRIC FILTER WITH A SHIELD ELECTRODE ON A PACKAGE PARTITION WALL

TECHNICAL FIELD

The present invention relates to a piezoelectric filter of the surface mounting type.

BACKGROUND ART

A piezoelectric filter using a thickness sliding oscillation or the like of a piezoelectric substrate is generally arranged such that there is housed, in a container, an element comprising a piezoelectric substrate of crystal or the like provided on one surface thereof with a pair of input/output oscillating electrodes (split electrodes) with a predetermined gap provided, and on the other surface thereof with a common electrode opposite to the pair of input/output oscillating electrodes.

Recently, such a piezoelectric filter is required to be made in a small size particularly for a portable-type communication device or the like. Further, to simplify the mounting process, it is required that the element is not only made in a small size, but also housed in a package of the surface mounting type. In such a structure in which the element in a small size is housed in a package of the surface mounting type, however, a leakage current is readily generated due to an electromagnetic coupling between the input/output oscillating electrodes. This is remarkably disadvantageous in that the assured attenuation amount is lowered.

To overcome the problem above-mentioned, there has been proposed a piezoelectric filter which comprises (i) a surface mounting-type package body made of an insulator in which a layer-like shield electrode uniform in grounding potential is formed on a flat portion and (ii) a piezoelectric filter element incorporated in and supported and by the package body, the piezoelectric filter element having a pair of input/output oscillating electrodes arranged to be opposite to the flat layer-like shield electrode, and in which the pair of input/output oscillating electrodes and the shield electrode are opposite to each other with a small distance provided therebetween (For example, Japanese Patent Laid-Open Publications No. 6-29776 and 6-85599 and U.S. Pat. No. 5,382,929).

According to the arrangement above-mentioned, as seen in each of the publications above-mentioned, the assured attenuation amount is increased by reducing the distance between the input/output oscillating electrodes and the shield electrode disposed at the package body. However, when the distance is reduced down to a certain limit value, the assured attenuation amount reaches the peak. As schematically shown in FIG. 10, when the distance is further reduced, floating capacitances C are generated between each of a pair of input/output oscillating electrodes 71, 72 and a shield electrode 73. Accordingly, a leakage current iL is generated between the pair of input/output oscillating electrodes 71, 72, causing the assured attenuation amount to be gradually reduced.

More specifically, even though a flat shield electrode is disposed opposite to a pair of input/output oscillating electrodes with a predetermined gap provided therebetween, the assured attenuation amount is limited to the peak value determined based on the distance between the shield electrode and the pair of input/output oscillating electrodes, and cannot be increased more than this peak value.

In view of the foregoing, the present invention is proposed with the object of providing a piezoelectric filter of the surface mounting type so arranged as to increase the assured attenuation amount as compared with the conventional piezoelectric filter.

DISCLOSURE OF THE INVENTION

To achieve the object above-mentioned, the present invention provides a piezoelectric filter of the surface mounting type including (i) a multiple-mode piezoelectric filter element in which a piezoelectric substrate is provided on one surface thereof with a pair of in put/output oscillating electrodes with a predetermined gap provided, and on the other surface thereof with a common electrode opposite to the pair of input/output oscillating electrodes, and (ii) a package body of the surface mounting type made of an insulating material, the filter element being supported, at predetermined positions of the periphery of the piezoelectric substrate, by the package body, and this piezoelectric filter is characterized in that the filter element is supported by the package body with the pair of input/output oscillating electrodes facing the package body, and that a shield electrode having a grounding potential is formed on that surface of the package body which faces the pair of input/output oscillating electrodes, the shield electrode extending along the gap between the pair of input/output oscillating electrodes, a predetermined distance being provided between the shield electrode and the piezoelectric substrate.

According to the present invention, the width of the shield electrode is preferably within four times of the width of the gap between the input/output oscillating electrodes.

According to the present invention, the shield electrode may be formed of a conductive material layer formed on the tip portion of a projecting portion having a triangular section, or may be formed of a wire.

According to the present invention, in addition to the shield electrode extending along the gap, two shield electrodes may be formed, at both sides of the first-mentioned shield electrode, on that surface of the package body which faces the pair of input/output oscillating electrodes. In such an arrangement, the distance between the piezoelectric substrate and the two shield electrodes is required to be greater than the distance between the piezoelectric substrate and the first-mentioned shield electrode extending along the gap.

As a specific mode of the arrangement having such two shield electrodes, the present invention may be arranged such that the package body has two pits, that the piezoelectric filter element is supported by the package body with the input/output oscillating electrodes respectively facing the two pits, predetermined peripheral portions of the input/output oscillating electrodes being supported by peripheral portions of the pits, that a shield electrode is formed on the top surface of a partition wall between the pits and extends along the gap between the input/output oscillating electrodes, and that two shield electrodes are respectively formed on the bottoms of the pits such that the two shield electrodes face the input/output oscillating electrodes respectively.

As another mode, the present invention may be arranged such that the package body has a pit, that the piezoelectric filter element is supported by the package body with the input/output oscillating electrodes facing the pit, predetermined peripheral portions of the input/output oscillating electrodes being supported by peripheral portions of the pit, that a shield electrode is formed on that portion of the top surface of the pit which faces the gap between the input/output oscillating electrodes, the shield electrode extending along the gap, and that a shield electrode is formed in a body forming the bottom of the package body, this shield electrode facing the input/output oscillating electrodes.

According to the present invention, the shield electrode having a grounding potential extends along the gap between the pair of input/output oscillating electrodes. This shield electrode intercepts lines of electric force generated between the pair of input/output oscillating electrodes. This prevents the input/output oscillating electrodes from being electromagnetically coupled with each other. This restrains the generation of a leakage current which causes the assured attenuation amount to be lowered. This shield electrode is not wholly opposite to the pair of input/output oscillating electrodes, but extends along the gap therebetween. Accordingly, even though the shield electrode is brought to the piezoelectric substrate as close as possible, no floating capacitances are generated between each of the shield electrode and the pair of input/output oscillating electrodes. Thus, the ability of preventing the electromagnetic coupling above-mentioned, cannot be deteriorated. Further, even though the shield electrode is formed of a conductive material layer formed on the tip portion of a projecting portion having a triangular section, or is formed of a wire, the shield electrode can similarly prevent the pair of input/output oscillating electrodes from being electromagnetically coupled with each other.

It was made sure that, when the width of the shield electrode extending along the gap is not greater than four times of the width of the gap, this restrains the floating capacitances from being generated between the shield electrode and each of the pair of input/output oscillating electrodes, thus providing good characteristics of assured attenuation amount.

The shield electrode extending along the gap, is not effective for intercepting the electromagnetic coupling between the pair of input/output oscillating electrodes and the outside. To prevent the pair of input/output oscillating electrodes from being electromagnetically coupled with the outside, it is desired to dispose, in addition to the shield electrode, another shield electrodes which respectively face the input/output oscillating electrodes. In such an arrangement, the shield electrodes for preventing the pair of input/output oscillating electrodes from being electromagnetically coupled with the outside, are not arranged to prevent the pair of input/output oscillating electrodes from being electromagnetically coupled with each other. Accordingly, the distance between each of the input/output oscillating electrodes and each of the shield electrodes for intercepting the electromagnetic coupling of the input/output oscillating electrodes with the outside, is set to a value not less than a predetermined value. This prevents floating capacitances from being generated between the input/output oscillating electrodes and the shield electrodes.

Such a shield electrode for intercepting the electromagnetic coupling of the input/output oscillating electrodes with the outside, may be formed in a body forming the bottom of the package body such that this shield electrode faces the input/output oscillating electrodes. Such a shield electrode also produces the effect of preventing the input/output oscillating electrodes from being electromagnetically coupled with the outside.

When the shield electrode having a grounding potential formed on that surface of the package body opposite to the input/output oscillating electrodes and extending along the gap therebetween, is to be formed of a conductive material layer on the tip portion of a projecting portion having a triangular section, a conductive material layer uniform in grounding potential may be formed on that surface of the package body which includes the projecting portion and which faces the input/output oscillating electrodes. In such an arrangement, the conductive material layer is brought very close to the piezoelectric substrate only at its portion which is opposite to the tip of the projecting portion and which extends along the gap. On the other hand, those other portions of the conductive material layer opposite to the input/output oscillating electrodes, are apart away by a sufficient distance from the piezoelectric substrate. Accordingly, in the arrangement above-mentioned, that portion of the conductive material layer which is opposite to the tip of the projecting portion, substantially forms a shield electrode for preventing the input/output oscillating electrodes from being electromagnetically coupled with each other, while other portion of the conductive material layer forms a shield electrode for preventing the input/output oscillating electrodes from being electromagnetically coupled with the outside. Thus, the arrangement above-mentioned also produces operational effects similar to those mentioned earlier.

BRIEF DESCRIPTION OF THE DRAWINGS

FIG. 4 shows the effect produced by the embodiment of the present invention in FIG. 1, in which

PREFERRED EMBODIMENTS OF THE INVENTION

Figure 1:
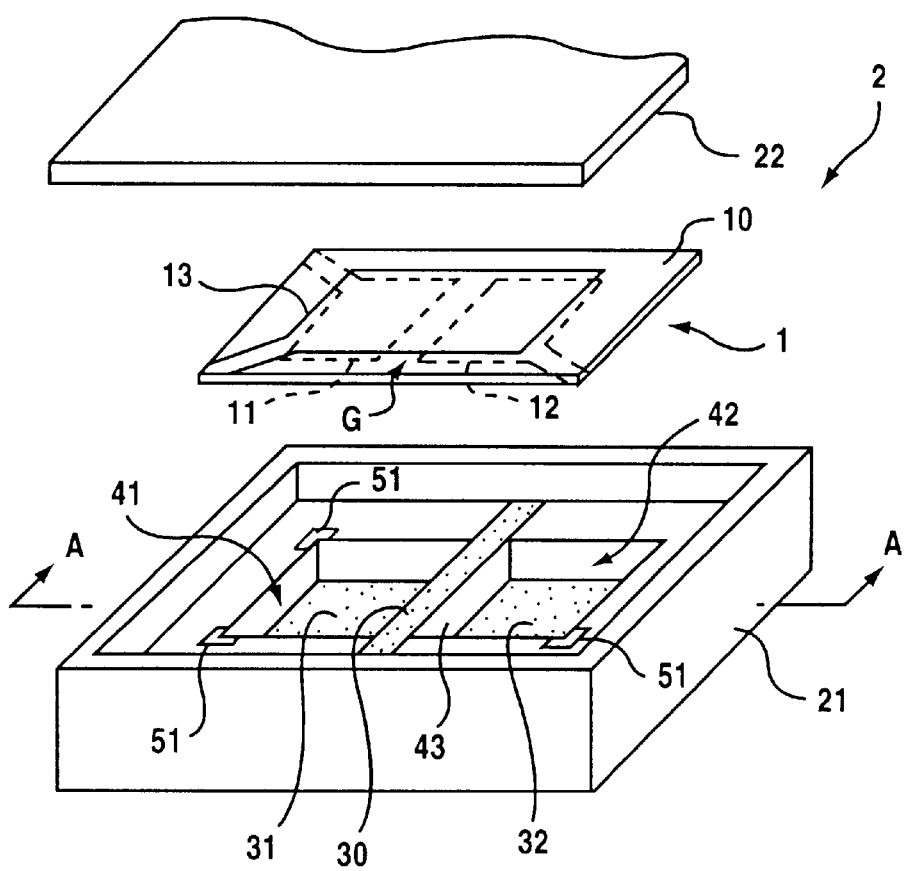
FIG. 1 is an exploded perspective view of an embodiment of the present invention.
Figure 2:
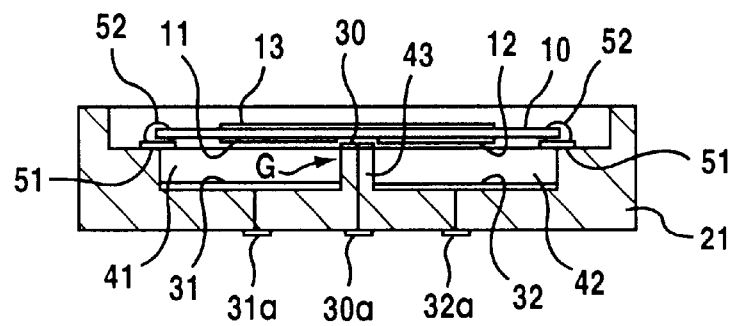
FIG. 2 is a section view taken along the line A—A in FIG. 1 with the lid 22 removed in the course of assembling.

FIG. 1 is an exploded perspective view of an embodiment of the present invention and FIG. 2 is a section view, taken along the line A—A in FIG. 1, with the lid 22 removed in the course of assembling.

A piezoelectric filter element 1 comprises a piezoelectric substrate 10 provided on one surface thereof with a pair of input/output oscillating electrodes 11, 12 with a predetermined gap G provided, and on the other surface thereof with a common electrode 13 opposite to the pair of input/output oscillating electrodes 11, 12. This piezoelectric filter element 1 is hermetically housed in a package 2 of the surface mounting type.

The package 2 comprises a package body 21 made of an insulating material such as ceramic or the like and the metallic lid 22 to be put, through a ring made of a Fe—Ni—Co alloy (not shown), on the top opening of the package body 21. The package body 21 has two pits 41, 42 arranged to be respectively opposite to the input oscillating electrode 11 and the output oscillating electrode 12 of the piezoelectric filter element 1 when assembled. A partition wall 43 between the pits 41, 42 extends along the gap G between the pair of input/output oscillating electrodes 11, 12.

With the input/output oscillating electrodes 11, 12 respectively facing the bottoms of the pits 41, 42, the piezoelectric filter element 1 is supported, at three corners of the piezoelectric substrate 10, by the package body 21 in the vicinity of peripheral portions of the pits 41, 42. In the piezoelectric substrate 10, the input/output oscillating electrodes 11, 12 and the common electrode 13 are introduced to three corners of the piezoelectric substrate 10 by respectively corresponding outgoing electrodes. The package body 21 has three connection pads 51 in the vicinity of the peripheries of the pits 41, 42 at the positions corresponding to the three corners above-mentioned. The piezoelectric substrate 10 is mechanically fixed onto the connection pads 51 at the three corners above-mentioned with conductive adhesives 52 such that the piezoelectric substrate 10 is not prevented from being vibrated, while the pair of input/output oscillating electrodes 11, 12 and the common electrode 13 are electrically connected to the connection pads 51 respectively. The connection pads 51 pass through the package body 21 and are connected to external connection pads (not shown) which are disposed on the underside of the package body 21 and which are to be used for surface mounting.

A shield electrode 30 is formed on the top of the partition wall 43 between the pits 41, 42 and extends along the gap G between the pair of input/output oscillating electrodes 11, 12 of the piezoelectric filter element 1. Shield electrodes 31, 32 are respectively formed on the bottoms of the pits 41, 42.

Each of the shield electrodes 30, 31, 32 is formed by metallizing, using a screen printing, the corresponding portion of a ceramic layer forming the package body 21 with tungsten (W) and then electrolytically plating the portion thus metallized, with Au. These shield electrodes 30, 31, 32 are connected, via through-holes passed through the package body 21, to grounding connection pads 30a, 31a, 32a which are disposed on the underside of the package body 21. Thus, each of the potentials of the shield electrodes 30, 31, 32 is equal to the grounding potential.

Figure 3:
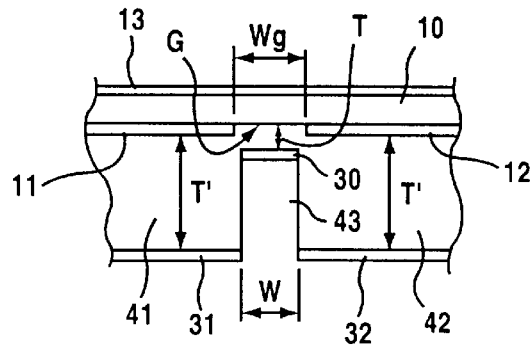
FIG. 3 is a schematic enlarged view of main portions of FIG. 2.

FIG. 3 is a schematic enlarged view of main portions of the filter of this embodiment. As shown in FIG. 3, the distance T between the piezoelectric substrate 10 and the shield electrode 30 on the partition wall 43 is about 10 $\mu$m and the distance T' between the piezoelectric substrate 10 and the shield electrodes 31, 32 on the bottoms of the pits 41, 42 is about 20 times of the distance T or about 0.2 mm. Further, the width of the partition wall 43 between the pits 41, 42 is 0.1 mm and the shield electrode 30 is formed on the entire width of the partition wall 43. Accordingly, the width W of the shield electrode 30 is equal to 0.1 mm. The width Wg of the gap G between the pair of input/output oscillating electrodes 11, 12 of the piezoelectric filter element 1 is equal to 0.11 mm.

According to the embodiment above-mentioned, the shield electrode 30 extends along the gap G between the pair of input/output oscillating electrodes 11, 12 and is disposed as brought to the piezoelectric substrate 10 as close as about 10 $\mu$m. Thus, the shield electrode 30 prevents the pair of electrodes 11, 12 from being electromagnetically coupled with each other when the element is driven. This prevents a leakage current from flowing between the electrodes 11, 12, thus greatly improving the assured attenuation amount of the piezoelectric filter.

Figure 4A:
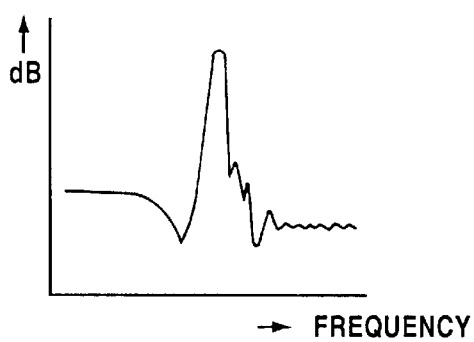
FIG. 4(A) is a graph illustrating the characteristics of the filter with the shield electrode 30 removed.
Figure 4B:
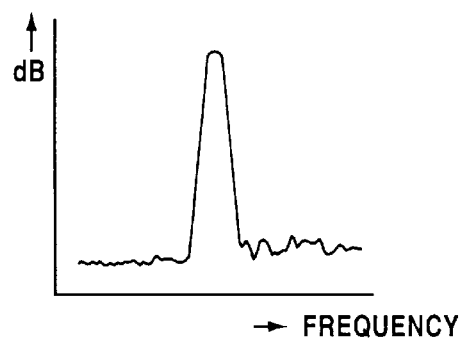
FIG. 4(B) is a graph illustrating the characteristics of the filter with the shield electrode 30 disposed.

FIG. 4 shows the effect produced by the embodiment in FIG. 1. More specifically, FIG. 4(A) shows the characteristics of the filter with the shield electrode 30 removed, and FIG. 4(B) shows the characteristics of the filter with the shield electrode 30 disposed. Thus, by disposing the shield electrode 30 on the filter, the filtering characteristics are considerably improved as shown in FIG. 4(B). It is now supposed that the center frequency F0 is set to 90 MHz and that the attenuation amount at frequency of F0–1 MHz is regarded as the assured attenuation amount. In this case, the assured attenuation amount without the shield electrode 30 disposed is about 55 dB and the assured attenuation amount with the shield electrode 30 having the width W and the distance T disposed is increased to about 90 dB.

Figure 5:
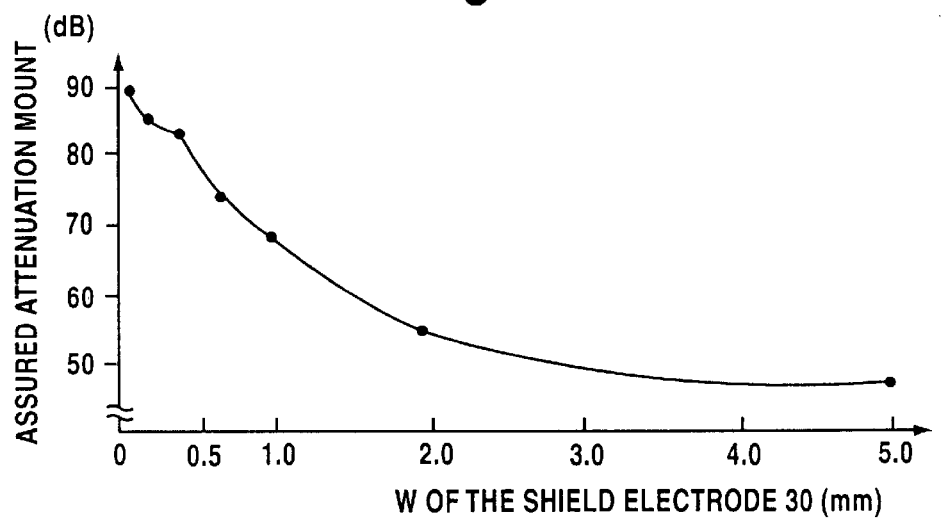
FIG. 5 is a graph illustrating changes in assured attenuation amount when only the width W of the shield electrode 30 is changed in the embodiment of the present invention in FIG. 1.

FIG. 5 is a graph illustrating changes in assured attenuation amount when only the width W of the shield electrode 30 is changed when the distance T between the shield electrode 30 and the piezoelectric substrate 10 is fixed to about 10 $\mu$m and when the width Wg of the gap G between the input/output oscillating electrodes 11, 12 is constant and equal to 0.11 mm. In FIG. 5, too, the filter center frequency F0 is equal to 90 MHz and the assured attenuation amount is the attenuation amount at frequency of F0–1 MHz.

As apparent from the graph in FIG. 5, the assured attenuation amount is lowered with an increase in the width W of the shield electrode 30. More specifically, when the width W of the shield electrode 30 is widened, undesired floating capacitances are generated between the shield electrode 30 and the pair of input/output oscillating electrodes 11, 12. When such floating capacitances are increased, a leakage current is generated between the pair of input/output oscillating electrodes 11, 12. According to tests, it was made sure that as far as the width W of the shield electrode 30 is within four times of the width Wg of the gap G between the pair of input/output oscillating electrodes 11, 12, the filter is less deteriorated due to floating capacitances and good characteristics of assured attenuation amount can be obtained.

According to tests, it was also made sure that as the distance T between the shield electrode 30 and the piezoelectric substrate 10 is reduced, there is increased the ability of preventing the input/output oscillating electrodes 11, 12 from being electromagnetically coupled with each other, thus providing good characteristics of good assured attenuation amount. However, it is preferable to set the distance T to about 10 $\mu$m in view of production easiness and yield. It is understood that, when the distance T is not greater than about 40 $\mu$m dependent on the width W of the shield electrode 30, the shield electrode 30 prevents the input/output oscillating electrodes 11, 12 from being electromagnetically coupled with each other, thus providing good characteristics of assured attenuation amount.

In the embodiment above-mentioned, the shield electrodes 31, 32 disposed on the bottoms of the pits 41, 42 mainly prevent the piezoelectric filter element 1 from being electromagnetically coupled with the outside, and do not render services too much to prevention of the electromagnetic coupling of the input/output oscillating electrodes 11, 12 with each other. Accordingly, to prevent the generation of undesired floating capacitances between the shield electrodes 31, 32 and the input/output oscillating electrodes 11, 12, it is preferable that the distance T' between the piezoelectric substrate 10 and the shield electrodes 31, 32 is set to a considerably increased value as compared with the distance T between the shield electrode 30 and the piezoelectric substrate 10. Thus, it is preferable to set the difference between the distances T and T' to not less than 0.1 mm.

The following description will discuss the structure and production method of the package body 21 in the embodiment above-mentioned.

The package body 21 has three layers, i.e., a layer lower than the bottoms of the pits 41, 42, a surrounding layer around the pits 41, 42 and a layer upper than the pits 41, 42. There may be adopted a production method in which a ceramic green sheet may be cut in the shape required for each layer, the layers are laminated and the laminated layers are then sintered. As to the shield electrodes 30, 31, 32, there may be adopted a method in which the corresponding parts in the green sheets are metallized and then electrolytically plated.

By using the package structure and the production method above-mentioned, the distance between the piezoelectric substrate 10 and the shield electrodes 31, 32 formed on the bottoms of the pits 41, 42, can sufficiently be increased, and the shield electrode 30 on the partition wall 43 can readily be brought to the piezoelectric substrate 10 as close as about 10 µm.

Figure 9:
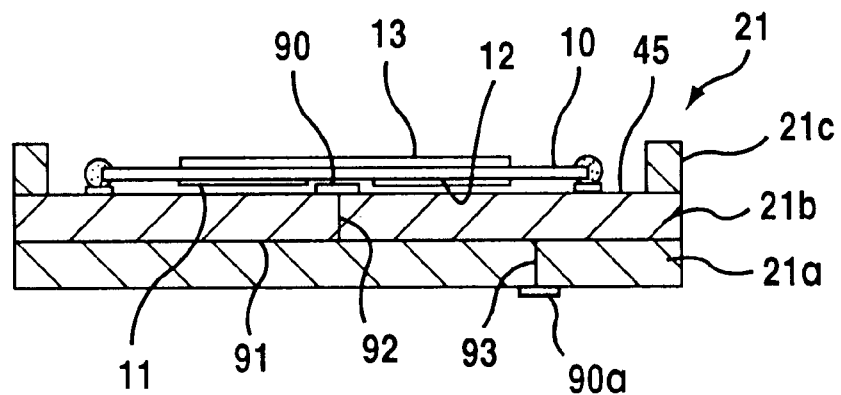
FIG. 9 is a section view of main portions of a still further embodiment of the present invention.
Figure 10:
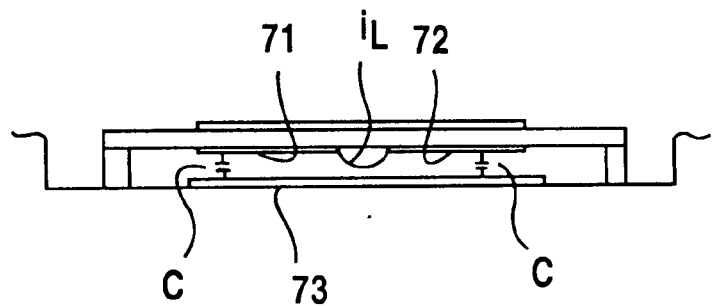
FIG. 10 shows a piezoelectric filter of prior art, illustrating how floating capacitances C are generated when there is reduced the distance between a pair of input/output oscillating electrodes and a shield electrode entirely opposite thereto.

The shield electrode for preventing the piezoelectric filter element 1 from being electromagnetically coupled with the outside, is not necessarily disposed on an inner surface of the package body 21. As shown in FIG. 9, for example, a shield electrode 91 for preventing the filter element from being electromagnetically coupled with the outside, may be formed in a body forming the bottom of the package body 21. In such an arrangement, the package body 21 has three layers, i.e., two layers 21b, 21a lower than the bottom of a pit 45 and a surrounding layer 21c around the pit 45. The shield electrode 91 for shielding an electromagnetic coupling with the outside is held, at the position opposite to the input/output oscillating electrodes 11, 12, by and between the layers 21a, 21b. A shield electrode 90 for preventing the input/output oscillating electrodes 11, 12 from being electromagnetically coupled with each other, is formed on the pit 45 and extends along a gap between the input/output oscillating electrodes 11, 12. The shield electrode 90 is connected to the shield electrode 91 through a through-hole 92 passed through the layer 21b, while the shield electrode 91 is connected, through a through-hole 93 passed through the layer 21a, to a grounding connection pad 90a formed at the underside of the package body 21. Thus, each of the shield electrodes 90, 91 presents a grounding potential.

The filter of the embodiment in FIG. 9 is produced by cutting each of ceramic green sheets into the shape required for each of the layers, by laminating the ceramic sheets thus cut, and by sintering the ceramic sheets thus laminated. Thus, the production method is the same as that mentioned earlier. However, each of the shield electrodes 90, 91 can be produced by printing a pattern of an electrode on the plane of a ceramic green sheet. This is advantageous in that patterning is achieved with high precision.

According to the present invention, the shield electrode 30, 90 may be modified in various manners. The following description will discuss some modifications thereof.

Figure 6:
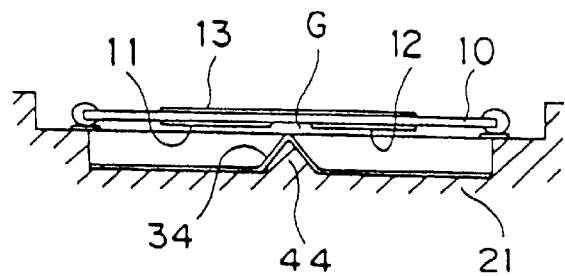
FIG. 6 is a section view of main portions of another embodiment of the present invention.

FIG. 6 is a section view of main portions of a piezoelectric filter according to another embodiment of the present invention. In FIG. 6, a package body 21 has a projecting portion 44 which has a triangular section and which extends along a gap G between a pair of input/output oscillating electrodes 11, 12. The package body 21 also has a conductive material layer 34 which includes the projecting portion 44, which is opposite to the pair of input/output oscillating electrodes 11, 12 and which is uniform in grounding potential. According to the arrangement above-mentioned, the conductive material layer 34 comes very close to the piezoelectric substrate 10 only at the tip of the projecting portion 44 along the gap G, while those portions of the conductive material layer 34 opposite to the input/output oscillating electrodes 11, 12, are sufficiently apart away from the piezoelectric substrate 10. In the arrangement in FIG. 6, the tip portion of the conductive material layer 34 opposite to the projecting portion 44 substantially forms the shield electrode 30 in the embodiment shown in FIG. 1, and other portions of the conductive material layer 34 substantially form the shield electrodes 31, 32 in the embodiment in FIG. 1. Thus, the embodiment in FIG. 6 produces operational effects similar to those produced by the embodiment in FIG. 1.

Figure 7:
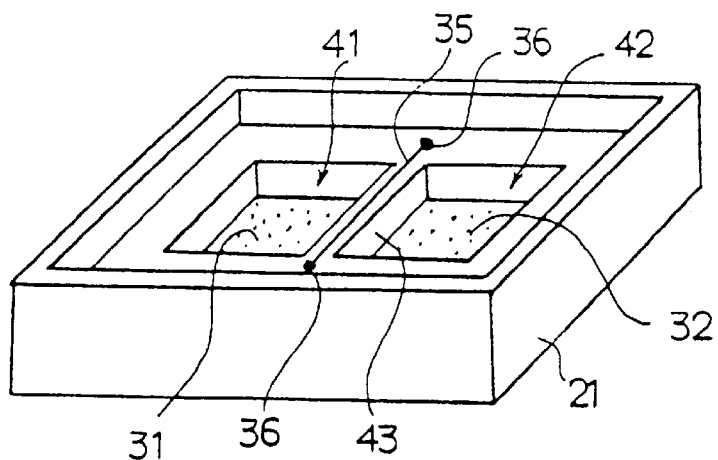
FIG. 7 is a perspective view of a package body of a further embodiment of the present invention.

FIG. 7 is a perspective view of a further embodiment of the present invention, in which a shield electrode is formed by a wire bonding. According to this embodiment, a package body 21 and shield electrodes 31, 32 are the same as those of the embodiment shown in FIG. 1. A wire 35 extends along the top of a partition wall 43 between two pits 41, 42. Each of the both ends of the wire 35 is bonded to the package body 21 with a conductive material 36 such as soldering or the like. For example, via through-holes formed in the package body 21 at its bonded portions, the both ends of the wire 35 are respectively connected to grounding connection pads (not shown) formed at the underside of the package body 21. According to this embodiment in FIG. 7, too, the wire 35 extends along the gap between the pair of input/output oscillating electrodes and can be brought very close to the piezoelectric substrate. Thus, this embodiment in FIG. 7 produces operational effects identical with those produced by the embodiment in FIG. 1.

Figure 8:
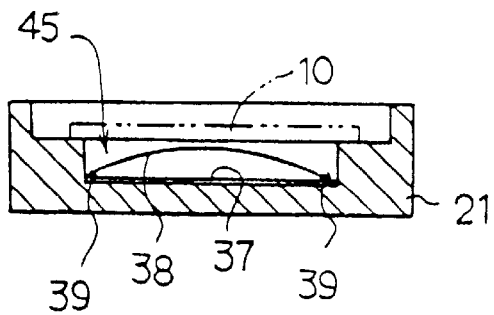
FIG. 8 is a section view of a package body of still another embodiment of the present invention, taken along the gap between the pair of input/output oscillating electrodes.

When using a wire as a shield electrode extending along the gap G between the pair of input/output oscillating electrodes, an arch-like wire may also be used instead of the wire 35 extending in a straight line along the partition wall 43 between the two pits 41, 42 as shown in FIG. 7. FIG. 8 is a section view of a package body 21, taken along the gap between input/output oscillating electrodes, of still another embodiment of the present invention. In the embodiment in FIG. 8, the package body 21 has a single pit 45 of which periphery supports a piezoelectric filter element (not shown). A shield electrode 37 is formed, as facing the pair of input/output oscillating electrodes, on the entire bottom surface of the pit 45. From the bottom of the pit 45, an arch-like wire 38 projects as extending along the gap between the pair of input/output oscillating electrodes. The arch apex of the wire 38 is brought close to the piezoelectric substrate 10, while each of the both ends of the arch-like wire 38 is connected to the shield electrode 37 through a conductive material 39. Via a through-hole, the shield electrode 37 is connected to a grounding connection pad (not shown) disposed at the underside of the package body 21. The embodiment in FIG. 8, too, produces operational effects similar to those produced by each of the embodiments above-mentioned.

Industrial Applicability

The piezoelectric filter of the surface mounting type according to the present invention is arranged such that a shield electrode having a grounding potential extends along the gap between a pair of input/output oscillating electrodes of the filter element, and that this shield electrode securely prevents the pair of input/output oscillating electrodes from being electromagnetically coupled with each other. This provides good characteristics of assured attenuation amount. Accordingly, the piezoelectric filter is advantageously incorporated in a communication device such as a portable telephone set which is particularly required to be made in a small size.

We claim:

1. In a piezoelectric filter including (i) a multiple-mode piezoelectric filter element in which a piezoelectric substrate is provided on one surface thereof with a pair of input/output oscillating electrodes with a predetermined gap provided, and on the other surface thereof with a common electrode opposite to said pair of input/output oscillating electrodes, and (ii) a package body of the surface mounting type made of an insulating material, said filter element being supported, at predetermined positions of the periphery of said piezoelectric substrate, by said package body, a piezoelectric filter of the surface mounting type characterized in that the filter element is supported by the package body with the pair of input/output oscillating electrodes facing said package body, and that a shield electrode having a grounding potential is formed on a surface of a partition wall of said package body which faces said pair of input/output oscillating electrodes, said shield electrode extending along the gap between said pair of input/output oscillating electrodes, a predetermined distance being provided between said shield electrode and said piezoelectric substrate wherein in addition to said shield electrode extending along said gap, two shield electrodes are formed, at both sides of said first-mentioned shield electrode, on that surface of said package body which faces said pair of input/output oscillating electrodes, the distances between said piezoelectric substrate and said two shield electrodes are greater than the distance between the piezoelectric substrate and said first-mentioned shield electrode extending along said gap and said partition wall of said package body is integrally formed with said package body.

2. In a piezoelectric filter including (i) a multiple-mode piezoelectric filter element in which a piezoelectric substrate is provided on one surface thereof with a pair of input/output oscillating electrodes with a predetermined gap provided, and on the other surface thereof with a common electrode opposite to said pair of input/output oscillating electrodes, and (ii) a package body of the surface mounting type made of an insulating material, said filter element being supported, at predetermined positions of the periphery of said piezoelectric substrate, by said package body, a piezoelectric filter of the surface mounting type characterized in that the filter element is supported by the package body with the pair of input/output oscillating electrodes facing said package body, and that a shield electrode having a grounding potential is formed on a surface of a partition wall of said package body which faces said pair of input/output oscillating electrodes, said shield electrode extending along the gap between said pair of input/output oscillating electrodes, a predetermined distance being provided between said shield electrode and said piezoelectric substrate, wherein the width of said shield electrode is not greater than four times of the width of said gap.

3. In a piezoelectric filter including (i) a multiple-mode piezoelectric filter element in which a piezoelectric substrate is provided on one surface thereof with a pair of input/output oscillating electrodes with a predetermined gap provided, and on the other surface thereof with a common electrode opposite to said pair of input/output oscillating electrodes, and (ii) a package body of the surface mounting type made of an insulating material, said filter element being supported, at predetermined positions of the periphery of said piezoelectric substrate, by said package body, a piezoelectric filter of the surface mounting type characterized in that the filter element is supported by the package body with the pair of input/output oscillating electrodes facing said package body, and that a shield electrode having a grounding potential is formed on a surface of a partition wall of said package body which faces said pair of input/output oscillating electrodes, said shield electrode extending along the gap between said pair of input/output oscillating electrodes, a predetermined distance being provided between said shield electrode and said piezoelectric substrate, wherein said shield electrode is formed of a conductive material layer formed on the tip portion of a projecting portion having a triangular section.

4. In a piezoelectric filter including (i) a multiple-mode piezoelectric filter element in which a piezoelectric substrate is provided on one surface thereof with a pair of input/output oscillating electrodes with a predetermined gap provided, and on the other surface thereof with a common electrode opposite to said pair of input/output oscillating electrodes, and (ii) a package body of the surface mounting type made of an insulating material, said filter element being supported, at predetermined positions of the periphery of said piezoelectric substrate, by said package body, a piezoelectric filter of the surface mounting type characterized in that the filter element is supported by the package body with the pair of input/output oscillating electrodes facing said package body, and that a shield electrode having a grounding potential is formed on a surface of a partition wall of said package body which faces said pair of input/output oscillating electrodes, said shield electrode extending along the gap between said pair of input/output oscillating electrodes, a predetermined distance being provided between said shield electrode and said piezoelectric substrate, wherein said shield electrode is formed of a wire.

5. A piezoelectric filter of the surface mounting type according to any of claims 1 to 4, wherein, said package body has a pit, said piezoelectric filter element is supported by said package body with said input/output oscillating electrodes facing said pit, predetermined peripheral portions of said input/output oscillating electrodes being supported by peripheral portions of said pit, said shield electrode extending along said gap is formed on that portion of the top surface of said pit which faces said gap between said input/output oscillating electrodes, and a shield electrode is formed in a body forming the bottom of said package body, said shield electrode facing said input/output oscillating electrodes.

6. In a piezoelectric filter including (i) a multiple-mode piezoelectric filter element in which a piezoelectric substrate is provided on one surface thereof with a pair of input/output oscillating electrodes with a predetermined gap provided, and on the other surface thereof with a common electrode opposite to said pair of input/output oscillating electrodes, and (ii) a package body of the surface mounting type made of an insulating material, said filter element being supported, at predetermined positions of the periphery of said piezoelectric substrate, by said package body, a piezoelectric filter of the surface mounting type characterized in that the filter element is supported by the package body with the pair of input/output oscillating electrodes facing said package body, and that a shield electrode having a grounding potential is formed on a surface of a partition wall of said package body which faces said pair of input/output oscillating electrodes, said shield electrode extending along the gap between said pair of input/output oscillating electrodes, a predetermined distance being provided between said shield electrode and said piezoelectric substrate, wherein, said package body has two pits, said piezoelectric filter element is supported by said package body such that said input/output oscillating electrodes respectively face said two pits, predetermined peripheral portions of said input/output oscillating electrodes being supported by peripheral portions of said pits, said shield electrode extending along said gap is formed on the top surface of a partition wall between said pits, two shield electrodes are respectively formed on the bottoms of said pits such that said two shield electrodes face said input/output oscillating electrodes respectively, and the distance between said piezoelectric substrate and said two shield electrodes is greater than the distance between said piezoelectric substrate and said first-mentioned shield electrode extending along said gap.

7. A piezoelectric filter of the surface mounting type according to claim 2 wherein, said package body has two pits, said piezoelectric filter element is supported by said package body such that said input/output oscillating electrodes respectively face said two pits, predetermined peripheral portions of said input/output oscillating electrodes being supported by peripheral portions of said pits, said shield electrode extending along said gap is formed on the top surface of a partition wall between said pits, two shield electrodes are respectively formed on the bottoms of said pits such that said two shield electrodes face said input/output oscillating electrodes respectively, and the distance between said piezoelectric substrate and said two shield electrodes is greater than the distance between said piezoelectric substrate and said first-mentioned shield electrode extending along said gap.

8. A piezoelectric filter of the surface mounting type according to claim 3, wherein a conductive material layer is formed on that surface of said package body which faces said pair of input/output oscillating electrodes and which includes said projecting portion having a triangular section, said conductive material layer being uniform in grounding potential.

9. A piezoelectric filter of the surface mounting type according to claim 3 wherein, said package body has two pits, said piezoelectric filter element is supported by said package body such that said input/output oscillating electrodes respectively face said two pits, predetermined peripheral portions of said input/output oscillating electrodes being supported by peripheral portions of said pits, said shield electrode extending along said gap is formed on the top surface of a partition wall between said pits, two shield electrodes are respectively formed on the bottoms of said pits such that said two shield electrodes face said input/output oscillating electrodes respectively, and the distance between said piezoelectric substrate and said two shield electrodes is greater than the distance between said piezoelectric substrate and said first-mentioned shield electrode extending along said gap.

10. A piezoelectric filter of the surface mounting type according to claim 4 wherein, said package body has two pits, said piezoelectric filter element is supported by said package body such that said input/output oscillating electrodes respectively face said two pits, predetermined peripheral portions of said input/output oscillating electrodes being supported by peripheral portions of said pits, said shield electrode extending along said gap is formed on the top surface of a partition wall between said pits, two shield electrodes are respectively formed on the bottoms of said pits such that said two shield electrodes face said input/output oscillating electrodes respectively, and the distance between said piezoelectric substrate and said two shield electrodes is greater than the distance between said piezoelectric substrate and said first-mentioned shield electrode extending along said gap.

* * * * *